United States Patent
Smith et al.

(10) Patent No.: US 7,106,103 B2
(45) Date of Patent: Sep. 12, 2006

(54) SELECTABLE INTEGRATED CIRCUIT INTERFACE

(75) Inventors: Glenn Michael Smith, Vancouver, WA (US); Paul D. Bliley, Vancouver, WA (US); Bill Eaton, Vancouver, WA (US); Walter D. Clark, Vancouver, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 160 days.

(21) Appl. No.: 10/732,384

(22) Filed: Dec. 10, 2003

(65) Prior Publication Data

US 2005/0127942 A1   Jun. 16, 2005

(51) Int. Cl.
 *H03K 19/0175* (2006.01)
(52) U.S. Cl. .......................................... 326/82; 326/38
(58) Field of Classification Search ............. 326/37–41
 See application file for complete search history.

(56) References Cited

U.S. PATENT DOCUMENTS

| | | | |
|---|---|---|---|
| 4,387,397 A | 6/1983 | Dietz | |
| 4,426,637 A | 1/1984 | Apple et al. | |
| 4,805,137 A | 2/1989 | Grant et al. | |
| 4,935,734 A | 6/1990 | Austin | |
| 5,703,759 A | 12/1997 | Trimberger | |
| 5,721,703 A | 2/1998 | Habersetzer et al. | |
| 5,929,655 A | 7/1999 | Roe et al. | |
| 6,034,542 A * | 3/2000 | Ridgeway | 326/39 |
| 6,218,858 B1 * | 4/2001 | Menon et al. | 326/39 |
| 6,271,679 B1 * | 8/2001 | McClintock et al. | 326/38 |
| 6,535,519 B1 | 3/2003 | Ghodrat | |
| 6,608,500 B1 * | 8/2003 | Lacey et al. | 326/39 |
| 6,778,526 B1 * | 8/2004 | Brown et al. | 370/351 |
| 6,825,689 B1 * | 11/2004 | Snyder | 326/41 |
| 6,973,597 B1 * | 12/2005 | Schroath et al. | 714/44 |

\* cited by examiner

*Primary Examiner*—Don Le

(57) ABSTRACT

In an implementation, a selectable integrated circuit interface includes selectable integrated circuit interface configurations that can each interface an integrated circuit. A selection circuit generates a selection signal to select an individual selectable integrated circuit interface configuration, and logic couples a clock signal and data to a selected integrated circuit interface configuration.

47 Claims, 7 Drawing Sheets

SELECTABLE INTEGRATED CIRCUIT INTERFACE

BACKGROUND

A bus is a network topology or communication circuit by which devices and/or components attached to the bus send and receive data. In an electronic or imaging device, for example, components of the device that are attached to the bus each have a unique address, or identity, by which a particular component can recognize data and/or a communication intended for the component. Imaging devices, such as printing devices and all-in-one devices that scan, print, and copy, have motors, motor drivers, power supplies, memory devices, and any one or more other similar components that are interfaced within a device by an integrated circuit. The integrated circuits interface the components for signal and data communications via a bus network within a device.

When designing and/or manufacturing a new device and components for the device, it may be desirable to use any number of available different integrated circuit interfaces to interface the components. For example, an existing or previously designed integrated circuit interface may be implemented initially due to cost and/or time constraints while a new integrated circuit interface is designed, tested, and implemented. However, implementing the new integrated circuit interface may cause compatibility problems.

BRIEF DESCRIPTION OF THE DRAWINGS

The same numbers are used throughout the drawings to reference like features and components.

DETAILED DESCRIPTION

A selectable integrated circuit interface can be implemented in an embodiment that includes selectable integrated circuit interface configurations which can each interface an integrated circuit. A selection circuit generates a selection signal to select an individual selectable integrated circuit interface configuration, and logic couples a clock signal, data, and optionally other signal(s) to a selected integrated circuit interface.

In an embodiment, a selectable integrated circuit interface can be implemented in a first configuration as a single integrated circuit interface slave that is coupled to a single integrated circuit interface master. Alternatively, the selectable integrated circuit interface can be implemented in a second configuration as a multiple integrated circuit interface slave that is coupled to a multiple integrated circuit interface master. This provides, for example, that a new component implemented in a device can be interfaced with any number of different integrated circuit interfaces when selected and coupled by the selectable integrated circuit interface.

Figure 1:
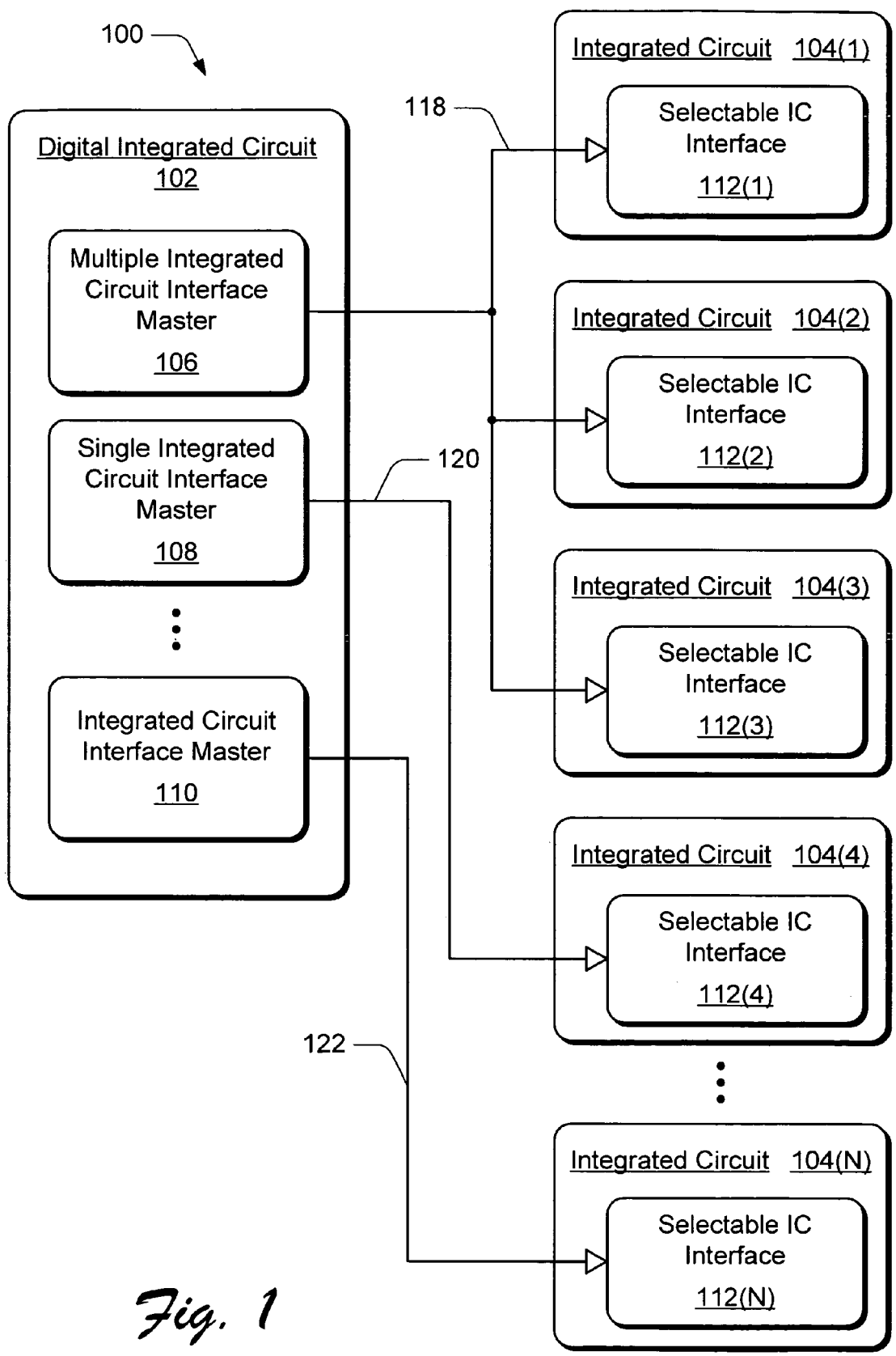
FIG. 1 illustrates an embodiment of a selectable integrated circuit interface system.

FIG. 1 illustrates an embodiment of a selectable integrated circuit interface system 100 that includes a digital integrated circuit 102 and additional integrated circuits 104(1–N). The digital integrated circuit 102 includes a multiple integrated circuit interface master 106, a single integrated circuit interface master 108, and any number of other integrated circuit interface masters, such as integrated circuit interface master 110. Each integrated circuit 104(1–N) includes a selectable integrated circuit interface 112(1–N), respectively.

Each of the selectable integrated circuit interfaces 112(1–N) includes any number of configurations and can be configured to interface a respective integrated circuit 104. In an embodiment, the selectable integrated circuit interfaces 112(1–3) can be configured as multiple integrated circuit interface slaves to the multiple integrated circuit interface master 106, and can be coupled to the multiple integrated circuit interface master 106 via a communication bus 118. In another embodiment, the selectable integrated circuit interface 112(4) can be configured as a single integrated circuit interface slave to the single integrated circuit interface master 108, and can be coupled to the single integrated circuit interface master 108 via a communication bus 120. A communication bus 122 couples the integrated circuit interface master 110 to the selectable integrated circuit interface 112(N).

In an embodiment, the selectable integrated circuit interfaces 112(1–N) are each configured to interface the integrated circuits 104(1–N), respectively. The integrated circuits 104(1–N) can be any number of component interface circuits, such as in an electronic or imaging device. For example, an integrated circuit 104 may be implemented to interface any one or more of motors, motor drivers, power supplies, supervisory circuits, analog to digital converters, general purpose input/outputs, dedicated circuits, memory devices, and any other similar components and devices in an electronic or imaging device. An example of an imaging device is described below with reference to an embodiment of a printing device 700 shown in FIG. 7. Printing device 700 includes examples of components and devices that may have an integrated circuit 104 which can be coupled to an integrated circuit interface master via a respective selectable integrated circuit interface 112(1–N).

Figure 2:
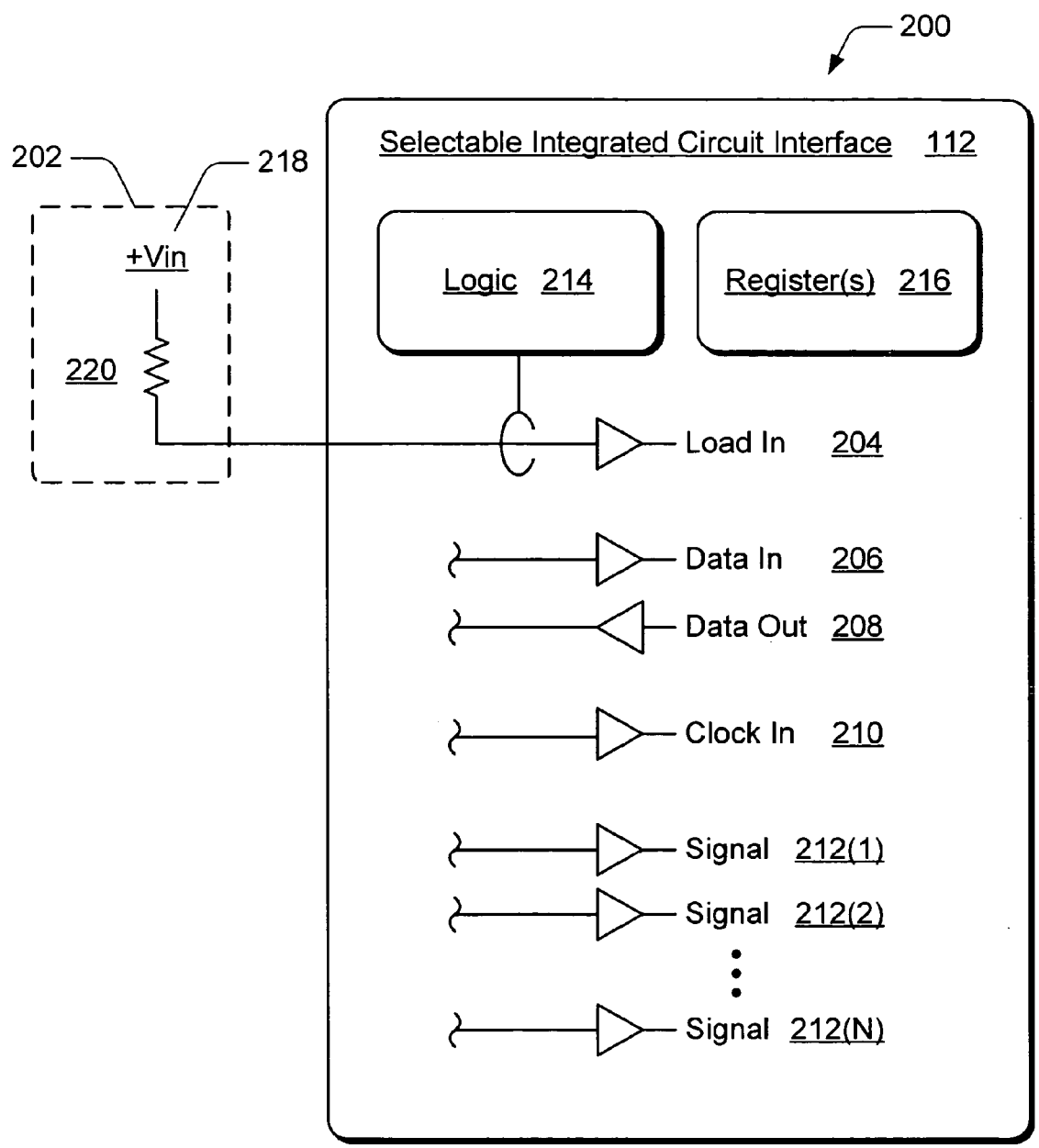
FIG. 2 illustrates an embodiment of a selectable integrated circuit interface in an embodiment of a selectable integrated circuit interface system.

FIG. 2 illustrates an embodiment of a selectable integrated circuit interface system 200 which includes a selection circuit 202 and an embodiment of a selectable integrated circuit interface 112 (e.g., any of the selectable integrated circuit interfaces 112(1–N) shown in FIG. 1). The selectable integrated circuit interface 112 includes a load line input 204, a data input 206, a data output 208, and a clock signal input 210. The selectable integrated circuit interface 112 also includes any number of signal inputs 212(1–N). In an embodiment, the signal inputs may be pulse width modulated signals for such component operation as a carriage motor, a paper feed motor, a service station motor, and the like which may be components of the printing device 700 shown in FIG. 7. The selectable integrated circuit interface 112 may also include logic 214 and one or more registers 216 that can be implemented to control functions of a device, such as motor activation, setting regulator voltage, initiating analog-to-digital circuits, and the like.

In an embodiment, the selection circuit 202 is configured to generate a high selection signal (e.g., a high potential) that is biased with a voltage input (+Vin) 218. The selection circuit 202 can also be configured to generate a low selection signal (e.g., a low potential) that is biased to ground. When biased to ground, the load input 204 can be used as an input of the selectable integrated circuit interface 112 for an integrated circuit interface configuration. The load input 204 can be biased with a high value pull-up resistor 220 of 1.5K ohms, for example, or with a low value pull down current (~2 ma) generated within circuitry of the interface 112.

The selection signal (e.g., a high signal, a low signal, or any range of a signal) is input to the selectable integrated circuit interface 112 on the load input 204 of the interface 112. In the example selection circuit 202, the pull-up resistor 220 generates the high selection signal on the load input 204 of the interface 112. In an alternate embodiment, a pull-down resistor can be implemented to generate a low selection signal on the load input 204 of the selectable integrated circuit interface 112. In another alternate embodiment, the selection circuit 202 can be implemented with a resistor divider and a comparator circuit, an analog-to-digital circuit, and/or any other different type of circuit implemented with interface 112 to detect a range of the selection signal for the load line input 204 of the interface 112.

The logic component 214 monitors the load input 204 of the selectable integrated circuit interface 112 (or optionally, the output(s) of a comparator circuit in an alternate embodiment) for the selection signal generated by the selection circuit 202. The logic component 214 couples inputs of the selectable integrated circuit interface 112 to configure the interface 112 as any one of different integrated circuit interface slave configurations according to a detected selection signal and a corresponding value of the detected selection signal.

In operation, the logic component 214 may detect a low selection signal generated by the selection circuit 202 and couple at least the load input 204, the data input 206, the data output 208, and the clock input 210 of the selectable integrated circuit interface 112(4) to the single integrated circuit interface master 108 (FIG. 1) via communication bus 120. Further, logic component 214 may detect a high selection signal generated by the selection circuit 202 and couple at least the data input 206 and the clock input 210 of the selectable integrated circuit interface 112(1) to the multiple integrated circuit interface master 106 (FIG. 1) via communication bus 118. The logic component 214 may also be implemented, or otherwise configured, to detect any other value, level, indication, or range of a selection signal and couple the input/outputs of the selectable integrated circuit interface 112(N) to the integrated circuit interface master 110 via the communication bus 122.

Figure 3:
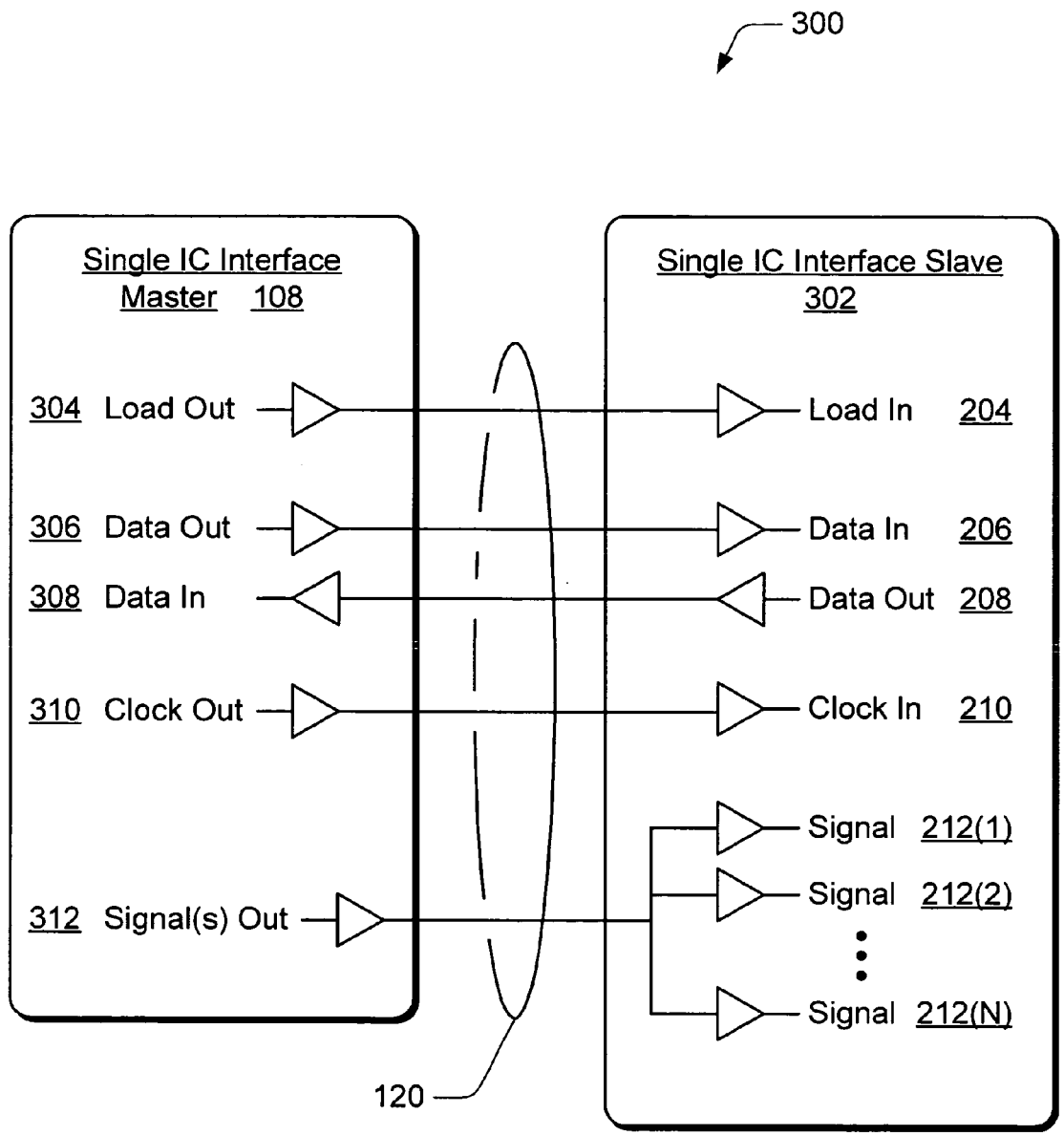
FIG. 3 illustrates an embodiment of a selectable integrated circuit interface implemented as a single integrated circuit interface slave to a single integrated circuit interface master.

FIG. 3 illustrates an embodiment of a selectable integrated circuit interface system 300 that includes an embodiment of a selectable integrated circuit interface implemented as a single integrated circuit interface slave 302 to the single integrated circuit interface master 108 (FIG. 1). The single integrated circuit interface slave 302 is an example of an implementation of the selectable integrated circuit interface 112(4) shown in FIG. 1.

The single integrated circuit interface master 108 includes a load line output 304, a data output 306, a data input 308, a clock signal output 310, and one or more signal outputs 312. When the logic component 214 (FIG. 2) detects a selection signal to select a configuration of the single integrated circuit interface slave 302, the logic component 214 couples one or more of the load line input 204, data input 206, data output 208, clock signal input 210, and one or more signal inputs 212(1–N) of the single integrated circuit interface slave 302 to the single integrated circuit interface master 108 via communication bus 120. The load line output 304 is coupled to the load line input 204, the data output 306 is coupled to the data input 206, the data input 308 is coupled to the data output 208, the clock signal 310 is coupled to the clock input 210, and the one or more signal outputs 312 are coupled to the signal inputs 212(1–N) all via the communication bus 120.

In an embodiment, the single integrated circuit interface master 108 is implemented to transmit and receive a sixteen-bit data word. A data transaction (e.g., a communication) begins when the single integrated circuit interface master 108 toggles the clock output line 310 and applies data to be communicated to the data output 306. On the rising edge of each clock received at the clock input 210, the single integrated circuit interface slave 302 clocks the data that is received at the data input 206 serially into an input shift register (not shown) of the length specified for that particular implementation of the interface 302.

At a specified setup time prior to the rising edge of clock for the last bit (e.g., bit zero "0"), the single integrated circuit interface master 108 applies a high signal to the load output 304 and holds it high for a specified hold time. This signifies to the single integrated circuit interface slave 302, when detected at the load input 204, that all of the data bits for a communication have been sent. At the next rising edge of the clock, the single integrated circuit interface slave 302 transfers all of the data bits received in the input shift register to an input word register (not shown) and begins receiving the next bit stream serially.

At approximately the same time, the single integrated circuit interface slave 302 transfers all bits from an output word register to an output shift register (registers not shown). Data from the output shift register is applied to the data output 208 of the single integrated circuit interface slave 302 at the falling edge of the clock (e.g., the clock received at the clock signal input 210). The single integrated circuit interface master 108 also clocks the data applied to data input 308 into a serial shift register (not shown) on the rising edge of the clock. The clock signal is generated internally in the single integrated circuit interface master 108. The single integrated circuit interface master 108 keeps track of the number of data bits transferred into the input shift register and transfers the data bits to the input word register when all of the data bits have been received.

Figure 4:
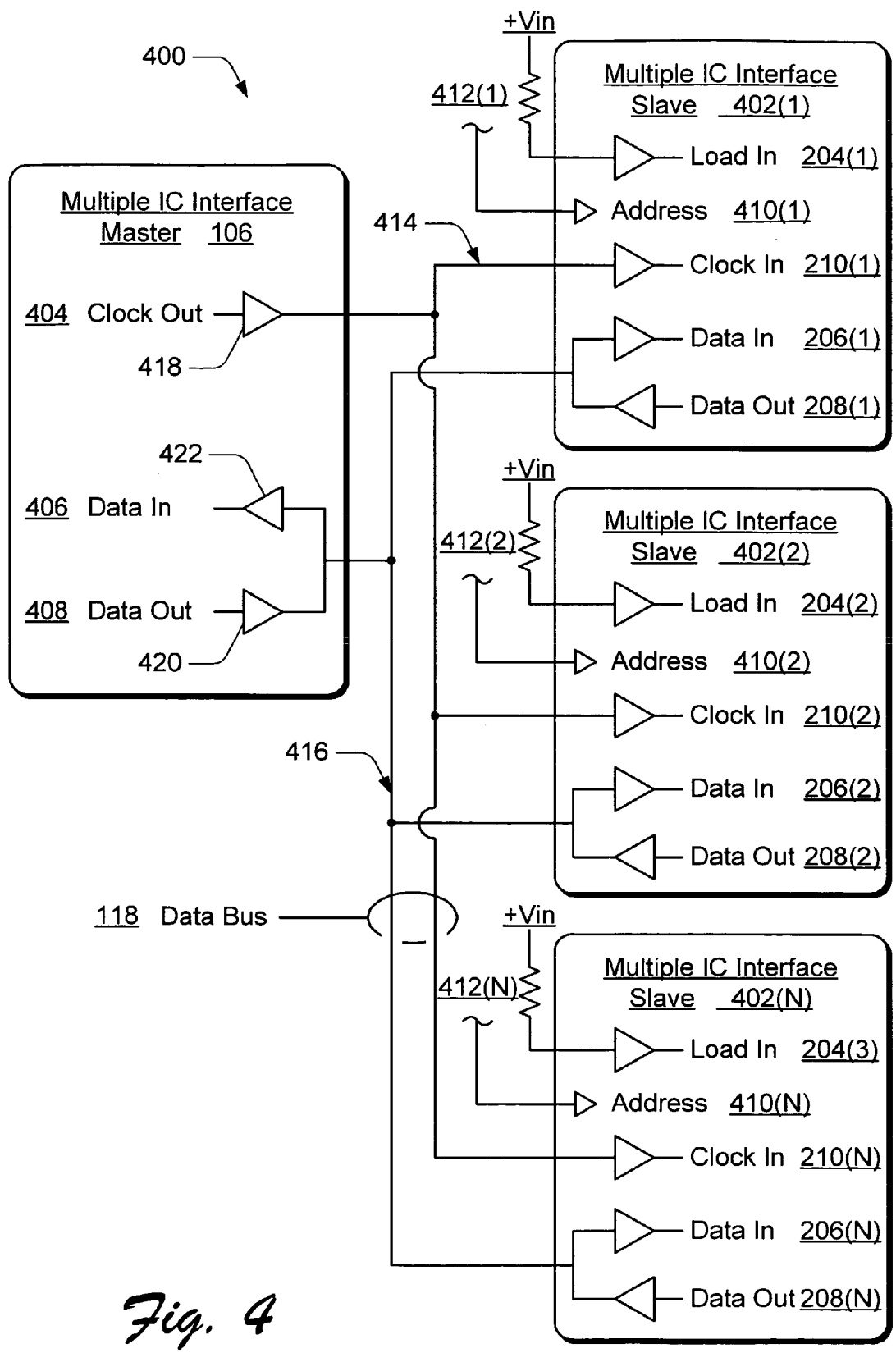
FIG. 4 illustrates an embodiment of a selectable integrated circuit interfaces implemented as a multiple integrated circuit interface slaves to a multiple integrated circuit interface master.

FIG. 4 illustrates an embodiment of a selectable integrated circuit interface system 400 that includes an embodiment of a selectable integrated circuit interfaces implemented as multiple integrated circuit interface slaves 402(1–N) to the multiple integrated circuit interface master 106 (FIG. 1). The multiple integrated circuit interface slaves 402(1–N) are an example of an implementation of the selectable integrated circuit interfaces 112(1–3) shown in FIG. 1 which are coupled to the multiple integrated circuit interface master 106 via communication bus 118. The multiple integrated circuit interface master 106 can be implemented to control data transactions to and from any number of multiple integrated circuit interface slaves 402(1–N).

The multiple integrated circuit interface master 106 includes a clock signal output 404, a bi-directional data line which is decoded into a data input 406, and a data output 408. Each of the multiple integrated circuit interface slaves 402(1–N) include a load line input 204(1–N), respectively, on which a selection signal is received. The logic component 214 (FIG. 2) of each multiple integrated circuit interface slave 402 detects the selection signal to select the configuration of the multiple integrated circuit interface slave 402. In this example, the selection circuit 202 generates a high selection signal (e.g., a high potential) that is biased with the voltage input (+Vin) across a pull-up resistor.

The multiple integrated circuit interface slaves 402(1–N) each include a unique address 410(1–N), respectively, that is a static input 412(1–N) to define each multiple integrated circuit interface slave 402. Additionally, each of the multiple integrated circuit interface slaves 402(1–N) include a clock input 210, a bi-directional data line which is decoded into a data input 206, and a data output 208 according to the configuration of a multiple integrated circuit interface slave 402. Additionally, any number of the signal inputs 212 can be utilized as a general purpose input/output of a multiple integrated circuit interface slave 402.

The communication bus 118 links the multiple integrated circuit interface master 106 to each of the multiple integrated circuit interface slaves 402(1–N). In an implementation, the communication bus 118 is a two-wire control communication bus that includes a clock signal link 414 and a data link 416. The clock output 404 of the multiple integrated circuit interface master 106 is coupled to each clock input 210(1–N) of the multiple integrated circuit interface slaves 402(1–N) via the clock signal link 414. In this embodiment, the data link 416 operates as a two-way data communication link (e.g., is bi-directional).

At the start of a data transaction, the data output 408 of the multiple integrated circuit interface master 106 is coupled to each data input 206(1–N) of the multiple integrated circuit interface slaves 402(1–N) also via the data link 416. All of the multiple integrated circuit interface slaves 402(1–N) receive an initial portion of the data transaction which includes the slave address 410 of the identified interface slave 402 to which the remainder of the data transaction is intended. When a slave device 402 is addressed for a read data transaction, the data input 406 of the multiple integrated circuit interface master 106 is coupled to the data link 416 for data transactions with any of the multiple integrated circuit interface slaves 402(1–N). A data output 208 for an identified multiple integrated circuit interface slave 402 is also coupled to the data link 416 for the data transaction with the multiple integrated circuit interface master 106. The identified multiple integrated circuit interface slave 402 is the interface slave that is addressed by the multiple integrated circuit interface master 106 for a read data transaction.

Timing of the system 400 is controlled to ensure that only one data transaction is enabled at any one time to preclude overlapping or interfering data transactions. The clock signal (e.g., clock output 404) is generated and timing of the system 400 is controlled by the multiple integrated circuit interface master 106. The multiple integrated circuit interface master 106 includes a push-pull driver 418 to drive the clock signal 404 on the clock signal link 414. Additionally, data transactions are initiated and controlled by the multiple integrated circuit interface master 106 and the multiple integrated circuit interface slaves 402(1–N) respond to commands from the multiple integrated circuit interface master 106. The multiple integrated circuit interface master 106 also includes a push-pull driver 420 to drive a data transaction on the data link 416, and includes a data receiver 422 to receive a data transaction from the data link 416.

For example, for a write data transaction to a first multiple integrated circuit interface slave 402(1), the multiple integrated circuit interface master 106 initiates a communication of write data from the multiple integrated circuit interface master 106 to the multiple integrated circuit interface slave 402(1) via the data link 416. Additionally, for a read data transaction from a second multiple integrated circuit interface slave 402(2), the multiple integrated circuit interface master 106 initiates a communication of read data from the multiple integrated circuit interface slave 402(2) to the multiple integrated circuit interface master 106 via the data link 416.

Figure 5:
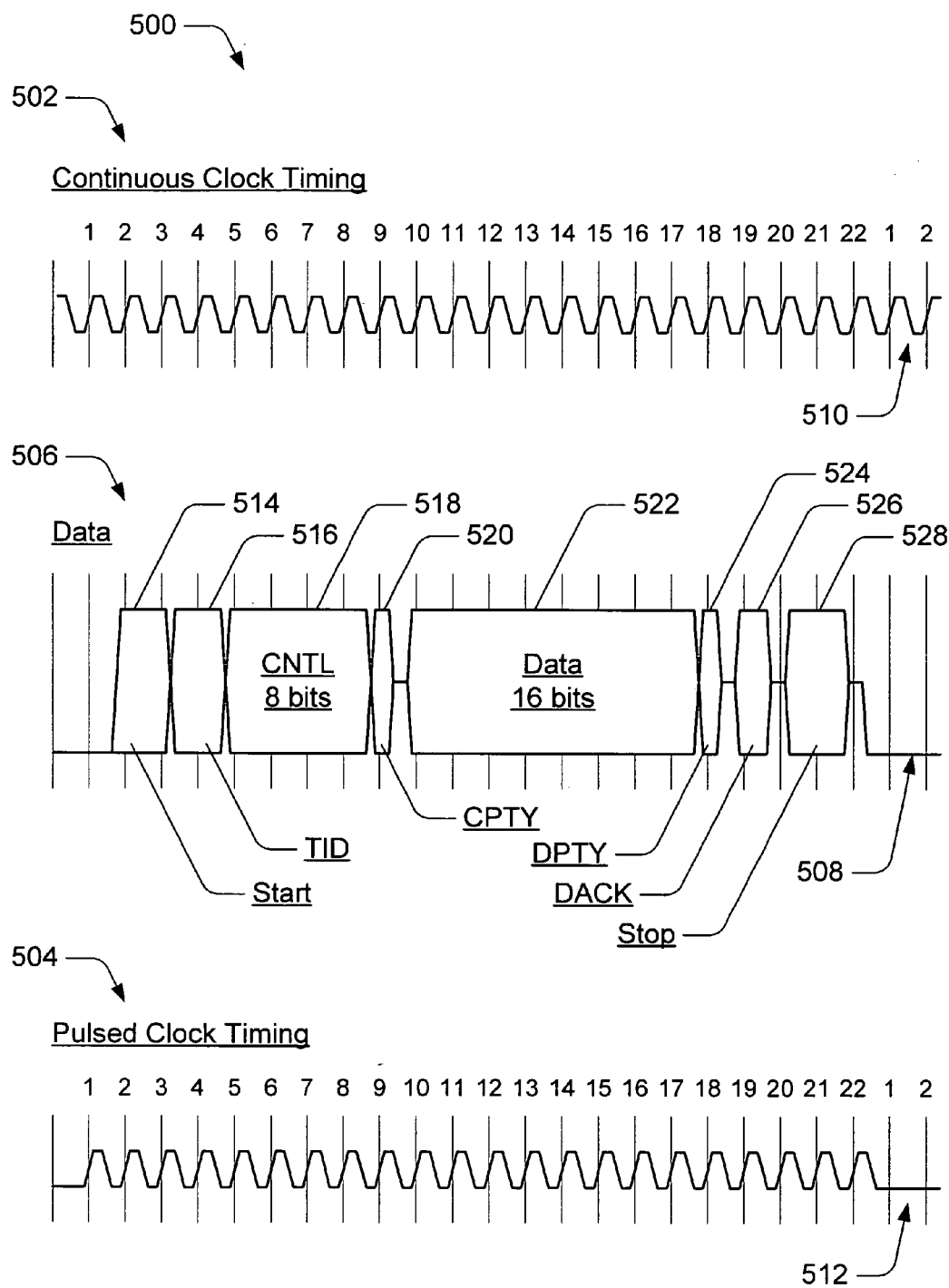
FIG. 5 illustrates an embodiment of timing diagrams for continuous clock timing and pulsed clock timing for data communication between the multiple integrated circuit interface slaves and the multiple integrated circuit interface master shown in FIG. 4.

FIG. 5 illustrates an embodiment of timing diagrams 500 for continuous clock timing 502 and pulsed clock timing 504 when data 506 is communicated between the multiple integrated circuit interface master 106 and a multiple integrated circuit interface slave 402. A clock signal, such as clock output 404, can be generated by the multiple integrated circuit interface master 106 as a continuous clock signal 502 or can be generated as a pulsed clock signal 504. After a data communication (e.g., a data bit transfer), indicated at 508 and after clock cycle twenty-two (22), the continuous clock signal 502 continues to cycle at 510 while the pulsed clock signal 504 goes idle (e.g., low in a single ended system or zero ("0") in a differential system) at 512. The pulsed clock 504 can be implemented to reduce electromagnetic interference generated by the clock signal.

In an embodiment, a data transaction is communicated during twenty-two (22) clock cycles as shown for the continuous clock timing 502 and the pulsed clock timing 504. A data communication 506 includes several components of data bits and, in this example, includes:

Start indication 514 is three (3) bits which initiates on a rising edge of the clock signal (e.g., continuous clock signal 502 or pulsed clock signal 504);

TID (target identifier) 516 is three (3) bits which identifies a particular integrated circuit (e.g., a target device);

CNTL (control) 518 is eight (8) bits which indicates or identifies a unique action, process, or data transaction (e.g., read, write, etc.) for the identified integrated circuit (e.g., the target device);

CPTY (control parity) 520 is one (1) bit plus one (1) bit for bus turnaround and is an odd parity value corresponding to the target identifier (TID) 516 and the control (CNTL) 518 values;

Data 522 is communicated as sixteen (16) bits from the sending device to the receiving device (e.g., to the target device);

DPTY (data parity) 524 is one (1) bit plus (1) bit for bus turnaround and is an odd parity value corresponding to the data 522 and which is communicated by the sending device to the receiving device;

DACK (data acknowledgment) 526 is two (2) bits plus one (1) bit for bus turnaround. The receiving device communicates the data acknowledgement to the sending device to indicate a successful reception of the data 522 and the data parity (DPTY) 524 values;

Stop indication 528 is three (3) bits which indicates a data transaction completion and is a communication from the sending device to the receiving device to acknowledge reception of a valid data acknowledgement (DACK) 526; and IDLE (e.g., 508) is three (3) bits plus one (1) bit for bus turnaround and is the idle time on the bus before another data transaction is initiated. The multiple integrated circuit interface master 106 drives a zero bit on the communication bus 118 during the idle 508.

The data bits (e.g., of data communication 506) are transferred on each edge of a clock signal (e.g., clock signals 502 and 504) so that operating frequencies are reduced and to enable efficient use of available bandwidth. This protocol enables controlling the multiple integrated circuits 202(1–N) with only one clock signal and one data signal. The protocol also enables the data error checking and recovery from a corrupted data transaction.

Each of the multiple integrated circuit interface slaves 402(1–N) monitor the clock signal link 414 and the data link 416. When a multiple integrated circuit interface slave 402 detects a start indication 514, it next receives the target identifier (TID) 516 which is compared to the respective multiple integrated circuit interface slave device identifier (e.g., address 410). A start indication 514 is driven by the multiple integrated circuit interface master 106. A multiple integrated circuit interface slave 402 identified by the target identifier (TID) 516 is the target device with which the multiple integrated circuit interface master 106 has initiated a data transaction.

The target identifier (TID) 516 is three (3) bits in this described embodiment which allows eight (8) unique addresses that multiple integrated circuit interface slaves 402 can utilize. However, selectable integrated circuit interface is not so limited. The target identifier (TID) 516 can be implemented with any number of data bits to allow addressing any number of multiple integrated circuit interface slaves (e.g., 402(1) to 402(N)).

The control component (CNTL) 518 defines an operation for the target device (e.g., the identified multiple integrated circuit interface slave 402) and includes a read/write bit to indicate which device is the sending device and which is the receiving device for a data transaction. In an embodiment, a multiple integrated circuit interface slave 402 determines an operation according to the control component (CNTL) 518 from a value that is maintained, such as with a memory component. The control parity (CPTY) 520 is communicated by the multiple integrated circuit interface master 106 to the target device (e.g., the identified multiple integrated circuit interface slave 402), and the data parity (DPTY) 524 is communicated by the sending device to the receiving device. In one embodiment, the control parity (CPTY) 520 and the data parity (DPTY) 524 are set such that the received value is odd (i.e., single bit odd parity). In another implementation, the error check can be implemented with a checksum, or with any number of other different error checking techniques.

Figure 6:
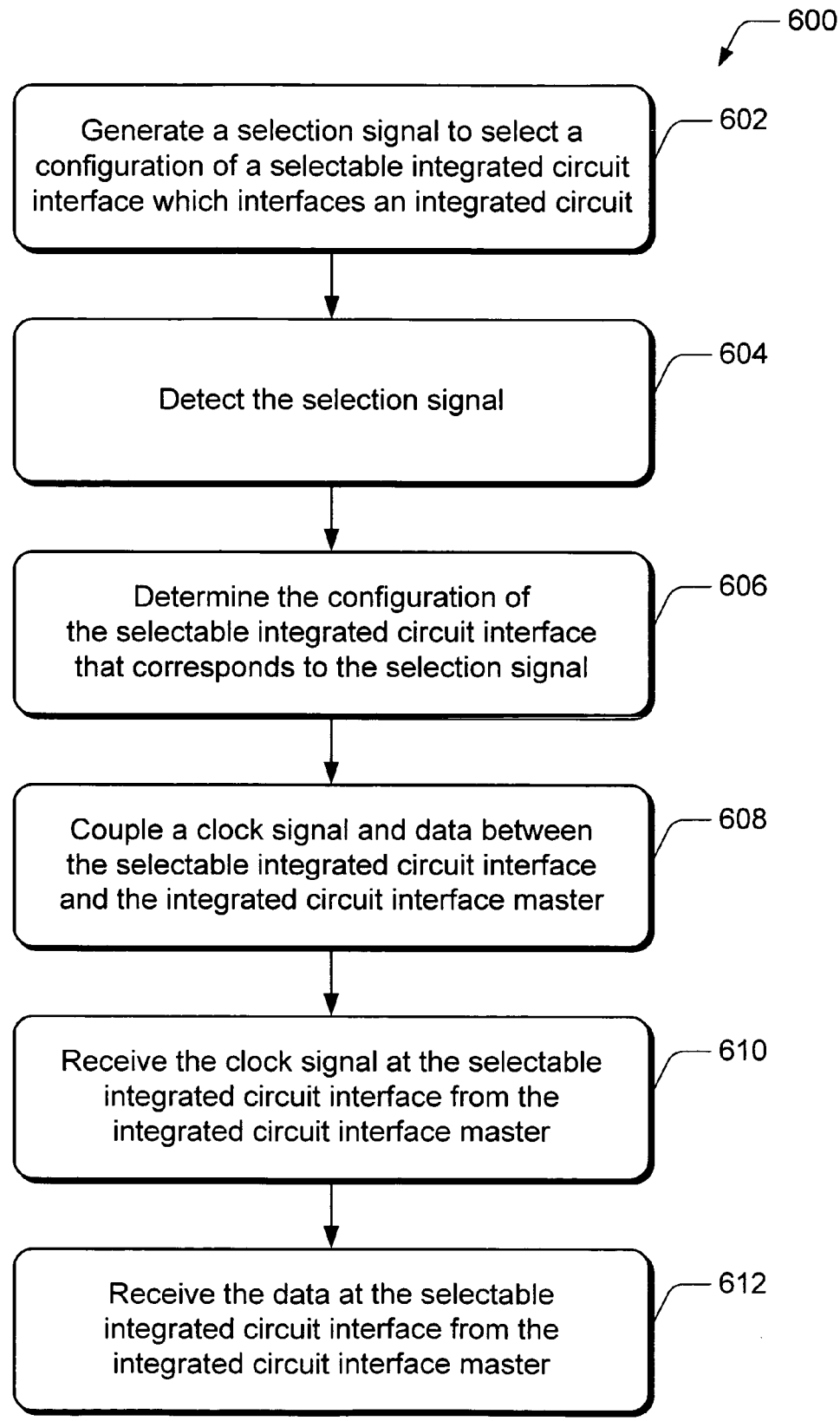
FIG. 6 is a flow diagram that illustrates an embodiment of a method for selectable integrated circuit interface.

FIG. 6 illustrates a method 600 for an embodiment of selectable integrated circuit interface. A method for selectable integrated circuit interface may be described in the general context of computer executable instructions. Generally, computer executable instructions include routines, programs, objects, components, data structures, and the like that perform particular function(s) or implement data type (s). The order in which the method is described is not intended to be construed as a limitation, and any number of the described method blocks can be combined in any order to implement the method. Furthermore, a method for selectable integrated circuit interface can be implemented in any suitable hardware, software, firmware, or combination thereof.

At block 602, a selection signal is generated to select a configuration of a selectable integrated circuit interface which is configured to interface an integrated circuit. For example, the selection circuit 202 (FIG. 2) generates a selection signal that is input to the selectable integrated circuit interface 112 on the load input 204. At block 604, the selection signal is detected. For example, logic 214 detects the selection signal generated by the selection circuit 202.

At block 606, the configuration of the selectable integrated circuit interface that corresponds to the selection signal is determined. For example, logic 214 determines which configuration of the selectable integrated circuit interface 112 corresponds to the selection signal generated by the selection circuit 202. This can include determining that the selection signal corresponds to a configuration of a multiple integrated circuit interface slave 402 (FIG. 4) and further, selecting the multiple integrated circuit interface slave as the configuration of the selectable integrated circuit interface. In such an embodiment, the integrated circuit interface master is a multiple integrated circuit interface master 106 (FIGS. 1 and 4). This can also include determining that the selection signal corresponds to a configuration of a single integrated circuit interface slave 302 (FIG. 3) and further, selecting the single integrated circuit interface slave as the configuration of the selectable integrated circuit interface. In such an embodiment, the integrated circuit interface master is a single integrated circuit interface master 108 (FIGS. 1 and 3).

At block 608, a clock signal and data are coupled between the selectable integrated circuit interface and the integrated circuit interface master. For example, the clock output 404 of the multiple integrated circuit interface master 106 (FIG. 4) is coupled to the clock inputs 210(1–N) of the multiple integrated circuit interface slaves 402(1–N), respectively, via the clock signal link 414. Further, the data input/output 406 and 408 of the multiple integrated circuit interface master 106 is coupled to the data input/outputs 206(1–N) and 208(1–N) of the multiple integrated circuit interface slaves 402(1–N), respectively, via the data link 416.

At block 610, the clock signal is received at the selectable integrated circuit interface from the integrated circuit interface master. For example, the clock signal output 404 of the multiple integrated circuit interface master 106 (FIG. 4) is received at the selectable integrated circuit interface (e.g., configured as a multiple integrated circuit interface slave 402) as clock input 210 via the clock signal link 414. For another example, the clock signal output 310 of the single integrated circuit interface master 108 (FIG. 3) is received at the selectable integrated circuit interface (e.g., configured as a single integrated circuit interface slave 302) as clock input 210 via the communication bus 120 (e.g., includes a clock signal link).

At block 612, the data is received at the selectable integrated circuit interface from the integrated circuit interface master. For example, the data output 408 of the multiple integrated circuit interface master 106 (FIG. 4) is received at the selectable integrated circuit interface (e.g., configured as a multiple integrated circuit interface slave 402) as data input 206 via the data link 416. For another example, the data output 306 of the single integrated circuit interface master 108 (FIG. 3) is received at the selectable integrated circuit interface (e.g., configured as a single integrated circuit interface slave 302) as the data input 206 via the communication bus 120. Further, the data output 208 of the single integrated circuit interface slave 302 is received at the single integrated circuit interface master 108 (FIG. 3) as the data input 308 via the communication bus 120 (e.g., which includes two data links).

Figure 7:
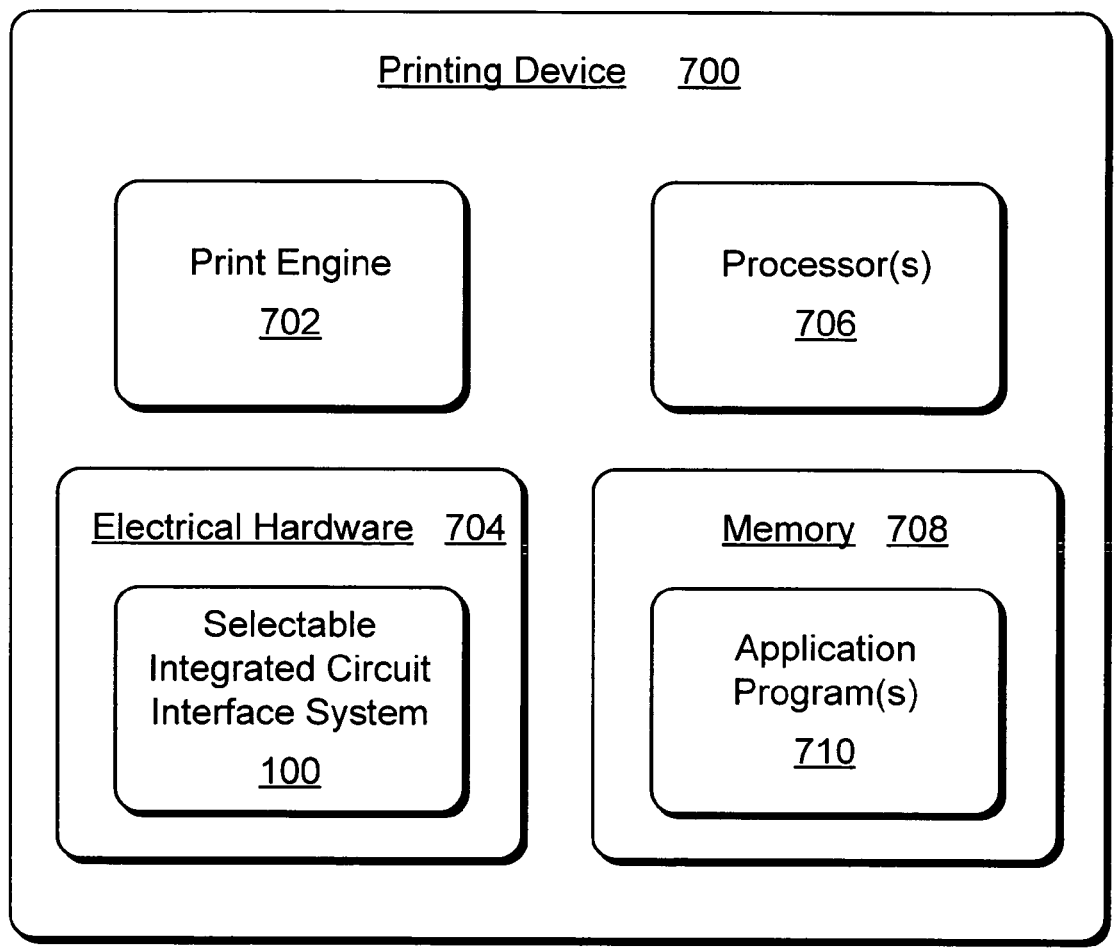
FIG. 7 illustrates various components of an embodiment of a printing device in which selectable integrated circuit interface can be implemented.

FIG. 7 illustrates various components of an embodiment of a printing device 700 in which selectable integrated circuit interface can be implemented. General reference is made herein to one or more printing devices, such as printing device 700. As used herein, "printing device" means any electronic device having data communications, data storage capabilities, and/or functions to render printed characters, text, graphics, and/or images on a print media. A printing device may be a printer, fax machine, copier, plotter, and the like. The term "printer" includes any type of printing device using a transferred imaging medium, such as ejected ink, to create an image on a print media. Examples of such a printer can include, but are not limited to, inkjet printers, electrophotographic printers, plotters, portable printing devices, as well as all-in-one, multi-function combination devices.

Printing device 700 includes a print engine 702 that includes mechanisms arranged to selectively apply an imaging medium such as liquid ink, toner, and the like to a print media in accordance with print data corresponding to a print job. The print media can include any form of media used for printing such as paper, plastic, fabric, Mylar, transparencies, and the like, and different sizes and types such as 8½×11, A4, roll feed media, etc. Printing device 700 also includes various electrical hardware 704 which may include a digital integrated circuit 102, an integrated circuit 104, and any of the various components of an embodiment of the selectable integrated circuit interface system 100 shown in FIG. 1.

Printing device 700 may include one or more processors 706 (e.g., any of microprocessors, controllers, and the like) which process various instructions (e.g., computer executable instructions) to control the operation of printing device 700 and to communicate with other electronic and computing devices. Further, printing device 700 can be implemented with one or more memory components 708, examples of which include random access memory (RAM), a disk drive, and non-volatile memory (e.g., any one or more of a ROM, flash memory, EPROM, EEPROM, etc.). The one or more memory components maintain information and data related to operational aspects of printing device 700, as well as application program(s) 710 which can be executed on processor(s) 706 to initiate and/or implement a method for an embodiment of selectable integrated circuit interface.

Although embodiments of selectable integrated circuit interface have been described in language specific to structural features and/or methods, it is to be understood that the subject of the appended claims is not necessarily limited to the specific features or methods described. Rather, the specific features and methods are disclosed as exemplary implementations of selectable integrated circuit interface.

The invention claimed is:

1. A selectable integrated circuit interface, comprising:
   selectable integrated circuit interface configurations each configured to interface an integrated circuit, at least one of the selectable integrated circuit interface configurations including a motor control input;
   a selection circuit configured to generate a selection signal to select an individual selectable integrated circuit interface slave configuration; and
   logic configured to couple a clock signal and data to the selected integrated circuit interface slave configuration from an integrated circuit interface master.

2. A printing device comprising the selectable integrated circuit interface as recited in claim 1.

3. A selectable integrated circuit interface as recited in claim 1, wherein the selected integrated circuit interface slave configuration is a single integrated circuit interface slave to which the logic couples the clock signal, a data input, a data output, and a load input from a single integrated circuit interface master.

4. A selectable integrated circuit interface as recited in claim 1, wherein the selected integrated circuit interface slave configuration is a multiple integrated circuit interface slave to which the logic couples the clock signal and the data from a multiple integrated circuit interface master.

5. A selectable integrated circuit interface as recited in claim 1, wherein the selectable integrated circuit interface configurations includes a multiple integrated circuit interface slave configured to interface data transactions between a multiple integrated circuit interface master and an integrated circuit, and wherein the multiple integrated circuit interface slave is further configured to receive the clock signal and receive a data transaction.

6. A selectable integrated circuit interface as recited in claim 1, wherein the selectable integrated circuit interface configurations includes a single integrated circuit interface slave configured to interface data transactions between a single integrated circuit interface master and an integrated circuit, and wherein the single integrated circuit interface slave is further configured to receive the clock signal and receive a data transaction.

7. A selectable integrated circuit interface as recited in claim 1, wherein the selection circuit is further configured to generate the selection signal to select a configuration of a multiple integrated circuit interface slave.

8. A selectable integrated circuit interface as recited in claim 1, wherein the selection circuit is further configured to generate the selection signal to select a configuration of a single integrated circuit interface slave.

9. A selectable integrated circuit interface as recited in claim 1, wherein the selection circuit is further configured to generate the selection signal to select a configuration of a multiple integrated circuit interface slave which is configured to interface data transactions between a multiple integrated circuit interface master and an integrated circuit, and wherein the multiple integrated circuit interface slave is further configured to receive the clock signal and receive a data transaction from the multiple integrated circuit interface master.

10. A selectable integrated circuit interface as recited in claim 1, wherein the selection circuit is further configured to generate the selection signal to select a configuration of a single integrated circuit interface slave which is configured to interface data transactions between a single integrated circuit interface master and an integrated circuit, and wherein the single integrated circuit interface slave is further configured to receive the clock signal and receive a data transaction from the single integrated circuit interface master.

11. A selectable integrated circuit interface as recited in claim 1, wherein the selected integrated circuit interface slave configuration is a multiple integrated circuit interface slave, and wherein the logic is further configured to couple a signal as a general purpose input/output of the multiple integrated circuit interface slave.

12. A selectable integrated circuit interface as recited in claim 1, wherein the selected integrated circuit interface slave configuration is a single integrated circuit interface slave having the motor control input, and wherein the logic is further configured to couple a data input, a data output, a load input, and a signal to the motor control input of the single integrated circuit interface slave.

13. A selectable integrated circuit interface as recited in claim 1, wherein the logic is further configured to detect the selection signal and select the integrated circuit interface slave configuration that corresponds to the selection signal.

14. An application-specific integrated circuit (ASIC) comprising the selectable integrated circuit interface as recited in claim 1.

15. A selectable integrated circuit interface system, comprising:
   selectable integrated circuit interfaces that each include integrated circuit interface configurations to interface an integrated circuit, at least one of the selectable integrated circuit interface configurations including a motor control input;
   an integrated circuit interface master configured to communicate a clock signal and a data signal to one or more of the selectable integrated circuit interfaces;
   a clock signal link configured to couple the integrated circuit interface master and a selected integrated circuit interface; and
   a data link configured to couple the integrated circuit interface master and the selected integrated circuit interface.

16. A selectable integrated circuit interface system as recited in claim 15, wherein the selected integrated circuit interface includes:
   a selection circuit configured to generate a selection signal to select an individual integrated circuit interface configuration; and
   logic configured to detect the selection signal and couple the clock signal link and the data link to the selected integrated circuit interface.

17. A selectable integrated circuit interface system as recited in claim 15, wherein the integrated circuit interface master is a single integrated circuit interface master, and wherein the selected integrated circuit interface is a single integrated circuit interface slave to which the clock signal link, a data input of the data link, a data output of the data link, and a load input are coupled by logic of the single integrated circuit interface slave.

18. A selectable integrated circuit interface system as recited in claim 15, wherein the integrated circuit interface master is a multiple integrated circuit interface master, and wherein the selected integrated circuit interface is a multiple integrated circuit interface slave to which the clock signal link and the data link are coupled by logic of the multiple integrated circuit interface slave.

19. A selectable integrated circuit interface system as recited in claim 15, wherein the selected integrated circuit interface includes a selection circuit configured to generate a selection signal to select a configuration of a multiple integrated circuit interface slave which is configured to interface data transactions between a multiple integrated circuit interface master and an integrated circuit, and wherein the multiple integrated circuit interface slave is further configured to receive the clock signal via the clock signal link and receive the data signal via the data link from the multiple integrated circuit interface master.

20. A selectable integrated circuit interface system as recited in claim 15, wherein the selected integrated circuit interface includes a selection circuit configured to generate a selection signal to select a configuration of a single integrated circuit interface slave which is configured to interface data transactions between a single integrated circuit interface master and an integrated circuit, and wherein the single integrated circuit interface slave is further configured to receive the clock signal via the clock signal link and receive the data signal via the data link from the single integrated circuit interface master.

21. A selectable integrated circuit interface system as recited in claim 15, wherein the selected integrated circuit interface is a multiple integrated circuit interface slave that includes logic configured to couple a signal as a general purpose input/output of the multiple integrated circuit interface slave.

22. A selectable integrated circuit interface system as recited in claim 15, wherein the selected integrated circuit interface configuration is a single integrated circuit interface slave having the motor control input and including logic configured to couple a data input of the data link, a data output of the data link, a load input, and a signal to the motor control input of the single integrated circuit interface slave.

23. A printing device comprising the selectable integrated circuit interface system as recited in claim 15.

24. A selectable integrated circuit interface system, comprising:
   an analog integrated circuit that comprises a selectable integrated circuit interface which includes integrated circuit interface configurations to interface the integrated circuit, the integrated circuit interface configurations including a multiple integrated circuit interface slave and a single integrated circuit interface slave; and
   a digital integrated circuit that comprises an integrated circuit interface master configured to communicate a clock signal and a data signal to the selectable integrated circuit interface.

25. A selectable integrated circuit interface system as recited in claim 24, wherein the selectable integrated circuit interface includes:
   a selection circuit configured to generate a first selection signal to select the multiple integrated circuit interface slave, and is further configured to generate a second selection signal to select the single integrated circuit interface slave; and
   logic configured to detect the selection signal and couple the clock signal and the data signal to the multiple integrated circuit interface slave in an event that the logic detects the first selection signal, and to the single integrated circuit interface slave in an event that the logic detects the second selection signal.

26. A selectable integrated circuit interface system as recited in claim 24, wherein the integrated circuit interface master is a single integrated circuit interface master, and wherein the selectable integrated circuit interface is configured as the single integrated circuit interface slave to which the clock signal, a data input, a data output, and a load input are coupled by logic of the selectable integrated circuit interface.

27. A selectable integrated circuit interface system as recited in claim 24, wherein the integrated circuit interface master is a multiple integrated circuit interface master, and wherein the selectable integrated circuit interface is configured as the multiple integrated circuit interface slave to which the clock signal and the data signal are coupled by logic of the selectable integrated circuit interface.

28. A selectable integrated circuit interface system as recited in claim 24, wherein:
   the integrated circuit interface master is a multiple integrated circuit interface master;
   the selectable integrated circuit interface includes a selection circuit configured to generate a selection signal to select a configuration of the multiple integrated circuit interface slave which is configured to interface data transactions between the multiple integrated circuit interface master and the analog integrated circuit; and the multiple integrated circuit interface slave is further configured to receive the clock signal and receive the data signal from the multiple integrated circuit interface master.

29. A selectable integrated circuit interface system as recited in claim 24, wherein:
the integrated circuit interface master is a single integrated circuit interface master;
the selectable integrated circuit interface includes a selection circuit configured to generate a selection signal to select a configuration of the single integrated circuit interface slave which is configured to interface data transactions between the single integrated circuit interface master and the analog integrated circuit; and
the single integrated circuit interface slave is further configured to receive the clock signal and receive the data signal from the single integrated circuit interface master.

30. A printing device comprising the selectable integrated circuit interface system as recited in claim 24.

31. A method, comprising:
generating a selection signal to select a configuration of an analog selectable integrated circuit interface configured to interface an integrated circuit;
coupling a clock signal and data between the analog selectable integrated circuit interface and a digital integrated circuit interface master;
receiving the clock signal at the analog selectable integrated circuit interface from the digital integrated circuit interface master; and
receiving the data at the analog selectable integrated circuit interface from the digital integrated circuit interface master.

32. A method as recited in claim 31, further comprising:
detecting the selection signal; and
determining the configuration of the analog selectable integrated circuit interface corresponding to the selection signal.

33. A method as recited in claim 31, further comprising:
detecting the selection signal; and
determining the configuration of the analog selectable integrated circuit interface as corresponding to a multiple integrated circuit interface slave.

34. A method as recited in claim 31, further comprising:
detecting the selection signal; and
determining the configuration of the analog selectable integrated circuit interface as corresponding to a single integrated circuit interface slave.

35. A method as recited in claim 31, further comprising selecting a multiple integrated circuit interface slave as the analog selectable integrated circuit interface, and wherein the digital integrated circuit interface master is a multiple integrated circuit interface master configured to communicate the clock signal and the data to the multiple integrated circuit interface slave.

36. A method as recited in claim 31, further comprising selecting a single integrated circuit interface slave as the analog selectable integrated circuit interface, and wherein the digital integrated circuit interface master is a single integrated circuit interface master configured to communicate the clock signal and the data to the single integrated circuit interface slave.

37. A method as recited in claim 31, further comprising selecting a single integrated circuit interface slave as the analog selectable integrated circuit interface, and wherein the digital integrated circuit interface master is a single integrated circuit interface master configured to communicate the clock signal, the data, and a load input to the single integrated circuit interface slave.

38. One or more computer-readable media comprising computer executable instructions that, when executed, direct a printing device to:
generate a selection signal to select a configuration of an analog selectable integrated circuit interface configured to interface an integrated circuit;
couple a clock signal and data between the analog selectable integrated circuit interface and a digital integrated circuit interface master;
receive the clock signal at the analog selectable integrated circuit interface from the digital integrated circuit interface master; and
receive the data at the analog selectable integrated circuit interface from the digital integrated circuit interface master.

39. One or more computer-readable media as recited in claim 38, further comprising computer executable instructions that, when executed, direct the printing device to:
detect the selection signal; and
determine the configuration of the analog selectable integrated circuit interface corresponding to the selection signal.

40. One or more computer-readable media as recited in claim 38, further comprising computer executable instructions that, when executed, direct the printing device to:
detect the selection signal; and
determine the configuration of the analog selectable integrated circuit interface as corresponding to a multiple integrated circuit interface slave.

41. One or more computer-readable media as recited in claim 38, further comprising computer executable instructions that, when executed, direct the printing device to
detect the selection signal; and
determine the configuration of the analog selectable integrated circuit interface as corresponding to a single integrated circuit interface slave.

42. One or more computer-readable media as recited in claim 38, further comprising computer executable instructions that, when executed, direct the printing device to select a multiple integrated circuit interface slave as the analog selectable integrated circuit interface, and wherein the digital integrated circuit interface master is a multiple integrated circuit interface master configured to communicate the clock signal and the data to the multiple integrated circuit interface slave.

43. One or more computer-readable media as recited in claim 38, further comprising computer executable instructions that, when executed, direct the printing device to select a single integrated circuit interface slave as the analog selectable integrated circuit interface, and wherein the digital integrated circuit interface master is a single integrated circuit interface master configured to communicate the clock signal and the data to the single integrated circuit interface slave.

44. A printing device, comprising:
means to generate a selection signal to select a configuration of an analog selectable integrated circuit interface configured to interface an integrated circuit;
means to couple a clock signal and data between the selectable integrated circuit interface and a digital integrated circuit interface master;
means to receive the clock signal at the analog selectable integrated circuit digital interface from the digital integrated circuit interface master; and means to receive the data at the analog selectable integrated circuit interface from the digital integrated circuit interface master.

45. A printing device as recited in claim 44, further comprising:
means to detect the selection signal; and
means to determine the configuration of the analog selectable integrated circuit interface corresponding to the selection signal.

46. A printing device as recited in claim 44, further comprising:
means to detect the selection signal; and
means to determine that the configuration of the analog selectable integrated circuit interface corresponds to a multiple integrated circuit interface slave.

47. A printing device as recited in claim 44, further comprising:
means to detect the selection signal; and
means to determine that the configuration of the analog selectable integrated circuit interface corresponds to a single integrated circuit interface slave.

* * * * *